United States Patent
Sen et al.

[11] Patent Number: 5,817,533
[45] Date of Patent: Oct. 6, 1998

[54] HIGH-YIELD METHODS OF FABRICATING LARGE SUBSTRATE CAPACITORS

[75] Inventors: Bidyut K. Sen, Milpitas; Michael G. Peters, Santa Clara; Richard L. Wheeler, San Jose; Wen-chou Vincent Wang, Cupertino, all of Calif.

[73] Assignee: Fujitsu Limited, Japan

[21] Appl. No.: 692,800

[22] Filed: Jul. 29, 1996

[51] Int. Cl.$^6$ .................................................. H01L 21/00
[52] U.S. Cl. ........................... 438/4; 438/14; 438/250; 438/393
[58] Field of Search .................... 438/250, 239, 438/381, 393, 4, 14

[56] References Cited

U.S. PATENT DOCUMENTS

| | | | |
|---|---|---|---|
| 3,506,506 | 4/1970 | Pennebaker, Jr. ........................... | 156/3 |
| 3,649,488 | 3/1972 | Pitetti et al. ............................... | 204/143 |
| 3,679,497 | 7/1972 | Handy et al. ............................... | 156/2 |
| 3,969,670 | 7/1976 | Wu ............................................. | 324/73 |
| 4,070,471 | 1/1978 | Djuric ....................................... | 29/25.42 |
| 4,259,367 | 3/1981 | Dougherty, Jr. ........................... | 427/96 |
| 4,748,537 | 5/1988 | Hernandez et al. ..................... | 361/306 |
| 4,853,827 | 8/1989 | Hernandez ................................ | 361/321 |
| 4,890,192 | 12/1989 | Smith ....................................... | 361/313 |
| 5,088,003 | 2/1992 | Sakai et al. ............................. | 361/330 |
| 5,162,194 | 11/1992 | Morgan .................................... | 430/319 |
| 5,608,246 | 3/1997 | Yeager et al. ........................... | 257/295 |
| 5,635,421 | 6/1997 | Ting ......................................... | 438/396 |

*Primary Examiner*—Tuan H. Nguyen
*Attorney, Agent, or Firm*—Coudert Brothers

[57] ABSTRACT

Described are methods of manufacturing large substrate capacitors for multi-chip module applications and the like using procedures compatible with common semiconductor fabrication procedures. A capacitor is formed where the top electrode thereof is divided into a plurality of segmented pads which are initially electrically isolated from one another. Each segmented pad forms a capacitor with the underlying dielectric layer and bottom capacitor electrode. Each segmented capacitor is electrically tested, and defective ones are identified. A conductive layer is thereafter formed over the segmented pads such that the conductive layer is electrically isolated from the pads of defective capacitors. The conductive layer electrically couples the good capacitors in parallel to form a high-value bypass capacitor which has low parasitic inductance. Large embedded MCM bypass capacitors can thereby be fabricated with minimal impact to the overall manufacturing yield. Novel testing methods within a scanning electron microscope environment are also disclosed.

26 Claims, 6 Drawing Sheets

HIGH-YIELD METHODS OF FABRICATING LARGE SUBSTRATE CAPACITORS

FIELD OF THE INVENTION

The present invention relates to methods of fabricating high-valued capacitors. In particular, the present invention relates to methods of manufacturing high-valued substrate capacitors for multi-chip module applications and the like using fabrication procedures compatible with common semiconductor fabrication procedures.

BACKGROUND OF THE INVENTION

Power distribution to microelectronic devices, such as integrated circuit chips is a major concern in many electronic applications. Of particular concern in the context of the present invention is power distribution to integrated circuits packaged in multichip modules. A multichip module ("MCM") is a form of packaging wherein a collection of IC chips are attached to one or more interconnected substrates. Multichip modules are used to improve overall system performance in several ways: the overall space needed to house the IC chips is significantly reduced, and by shortening the distance between chips within the module, high speed device operation is facilitated, e.g., power consumption, interconnect inductance and signal transmission delays are all reduced. MCMs may be designed to incorporate additional features such as an integral IC chip cooling system.

It is important and desirable to provide bypass capacitance in close proximity to the integrated circuit chips in a multiple chip module, and the need for such capacitance increases as the switching speed of the devices becomes higher. In some designs, discrete capacitors are mounted as separate components on the surface of the MCM substrate. Unfortunately, this arrangement uses up valuable "real estate" on the surface of the MCM and suffers from the fact that such capacitors are not as close to the IC chips as needed, thereby unduly limiting the operating speed of the IC chips.

Another approach is to incorporate bypass capacitance into the multilayered MCM substrate by forming capacitor plates within the MCM substrate. This technique generally requires a large plate area, and adds complexity to the multilayered substrate. The fabrication yield of MCM substrates is directly related to the number of layers in the structure and is particularly related to the formation of any embedded bypass capacitors. The capacitors are particularly susceptible to breakdown due to small defects and the thinness of the dielectric layers used to separate capacitor plates. As a general rule, increasing the plate area of these embedded capacitor structures increases the probability of a shorting defect occurring in the structure. Fabrication yield is a significant concern in the design and construction of complex multichip modules. In many designs, a failure in any individual component of the module, such as an embedded capacitor, will result in the entire module becoming useless.

Accordingly, as the sizes of embedded bypass capacitors are increased to meet increased MCM operating speeds, the yields of the MCM substrates decrease, making it difficult to increase MCM performance in a cost effective manner. There is a need in the MCM field to enable the fabrication of large embedded bypass capacitors in MCM substrates with minimal impact to the overall manufacturing yield and cost.

SUMMARY OF THE INVENTION

Broadly stated, the present invention comprises forming a capacitor structure where the top electrode of the capacitor is divided into a plurality of segmented pads which are initially electrically isolated from one another. Each segmented pad forms a capacitor with the underlying dielectric layer and bottom capacitor electrode. Each of the segmented capacitors is electrically tested, and any defective capacitors are identified. A conductive layer is thereafter formed over the segmented pads such that the conductive layer is electrically isolated from the pads of defective capacitors. The conductive layer electrically couples the good capacitors in parallel to form a high-value bypass capacitor which has low parasitic inductance. Large embedded MCM bypass capacitors can thereby be fabricated with minimal impact to the overall manufacturing yield and cost since each defective capacitor is identified and isolated well before the completion of the MCM substrate.

In constructed embodiments of the present invention, the segmented pads have relatively large areas and the corresponding capacitor structures can be readily tested in a variety of ways. For example, test probes contacting respective segmented pads can be used to electrically test the corresponding capacitors. As a novel feature of the present invention, the segmented pads may be tested by viewing the pads in a scanning electron microscope. In this approach, the bottom electrode is grounded, and electrons accumulate on the segmented pads of good capacitor structures, which generates a negative voltage thereon. In defective capacitors, the electrons are shorted to ground, which keeps the pad voltage near zero volts. The different pad voltages creates a color, or contrast, difference between the pads of good and bad capacitors.

A pad of a defective capacitor may be electrically isolated from the overlying conductive layer by forming an insulating cap layer around the pad before the conductive layer is formed over the pads of the good capacitors. As another approach, the conductive layer may be formed over all the pads and the defective pads may be isolated by scribing, or cutting, through the conductive layer around the perimeters of the defective pads.

Accordingly, it is an object of the present invention to provide structures and methods for making high-valued capacitors having high yield.

It is another object of the present invention to increase the manufacturing yield of substrate capacitors.

It is still another object of the present invention to enable the construction of very high-valued capacitors.

This and other objects of the present invention will become apparent to those skilled in the art from the following detailed description of the invention, the accompanying drawings, and the appended claims.

DETAILED DESCRIPTION OF THE INVENTION

Figure 1:
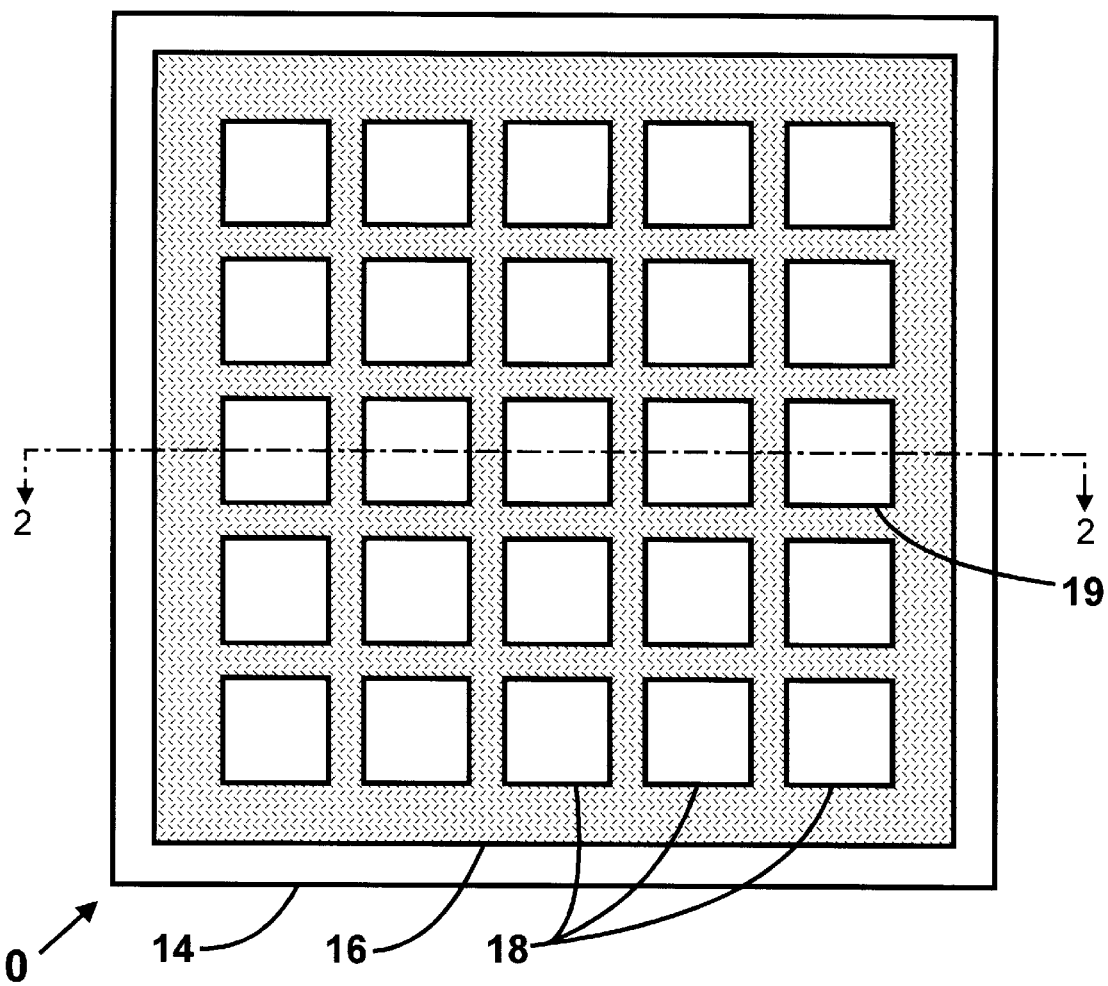
FIGS. 1 and 4 are top-plan views.
Figure 2:
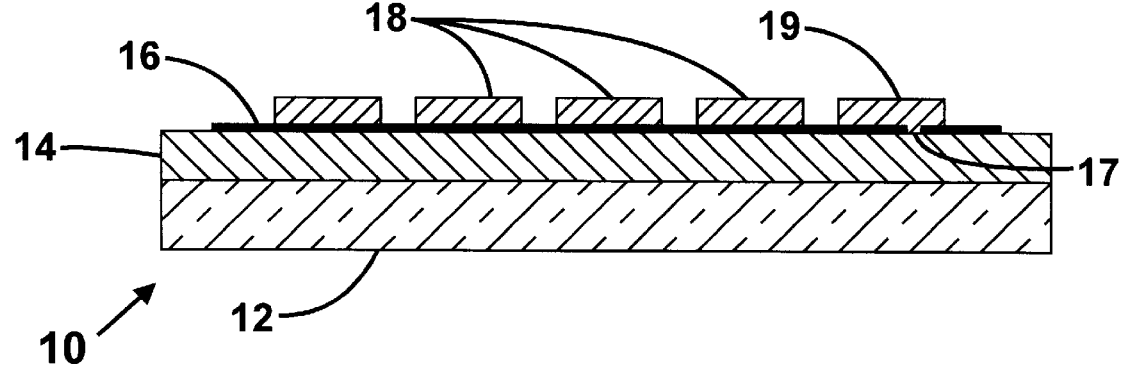
FIGS. 2–3 and 5–6 are cross-sectional views of a capacitor structure during fabrication according to a first preferred method according to the present invention.

The methods according to the present invention first form a capacitor structure having a first (bottom) conductive layer, a dielectric layer formed over the first conductive layer, and a plurality of conductive pads formed over the dielectric layer. FIG. 1 shows a top-plan view of an exemplary capacitor structure having a first conductive layer 14, a dielectric layer 16, and a plurality of conductive pads 18. FIG. 2 shows a cross-section of the capacitor structure along the cross-section plane indicated in FIG. 1. First conductive layer 14 may be a conductive metal plate or sheet, or may be a conductive layer which is formed over a substrate 12. Substrate 12 may comprise a conductive, semiconductive, or insulating material. Conductive layer 14 may be of any suitable shape.

Conductive pads 18 are electrically isolated from one another. They may be of any suitable shape (e.g., triangular, square, rectangular, pentagonal, hexagonal, etc.), and are preferably, but not necessarily, of substantially the same shape and size (dimensions). Each pad 18 forms a capacitance with the underlying dielectric layer 16 and first conductive layer 14, which is herein referred to as a segmented capacitor structure. A defective segmented capacitor structure is shown at 19 in FIGS. 1 and 2. In the defective capacitor structure, a pinhole 17 has been inadvertently formed in dielectric layer 16, which causes the corresponding conductive pad 18 to form an electrical short to first conductive layer 14.

Pinhole defects can be formed during the formation process for dielectric layer 16 due to local variations in the process' deposition rate and uniformity, and can be induced by particulate contaminates, which interfere with the dielectric formation process. In order to achieve high capacitance values, capacitor dielectric layers are generally made as thin as possible, which causes local variations in uniformity and formation rate to have a higher chance of causing voids to occur during dielectric formation. Particulate contamination can interfere with deposition processes by casting shadows, and can interfere with anodization processes by blocking access of the anodizing solution.

If first conductive layer 14 is formed over substrate 12, rather than being formed as a plate or sheet, layer 14 may be formed by any number of methods known in the art. For example, conductive layer 14 may comprise a metal which can be evaporated, sputtered, deposited by chemical vapor deposition (CVD) processes, electro-plated, etc. The particular type of material used for first conductive layer 14, and the particular manner in which layer 14 is formed, are not essential to the present invention and do not form a part thereof. Similarly, dielectric layer 16 may comprise any dielectric material and may be formed by any method known in the art. Exemplary formation processes include, but are not limited to, sputtering, evaporation, and deposition processes, and anodization and oxidation with a suitable base material. The particular material of dielectric layer 16, and the particular manner of forming layer 16, are not essential to the present invention and do not form a part thereof. Conductive pads 18 may be formed with any of the materials and methods indicated for first conductive layer 14. Pads 18 may be defined by any method known to the art, including but not limited to deposition or sputtering through masks, formation followed by pattern etching with appropriate photo masks and etchants, formation over a lift-off mask in a lift-off process. The particular material of pads 18, and the particular manner of forming pads 18, are not essential to the present invention and do not form a part thereof.

After forming layers 14 and 16 and pads 18, each of the resulting segmented capacitor structures is electrically tested to determine whether any of the structures are defective. After the defective capacitor structures are identified, a second conductive layer is formed over the pads 18 such that the second conductive layer is electrically coupled to the pads 18 of good segmented capacitor structures and electrically isolated from pads 18 of defective segmented capacitor structures.

Figure 3:
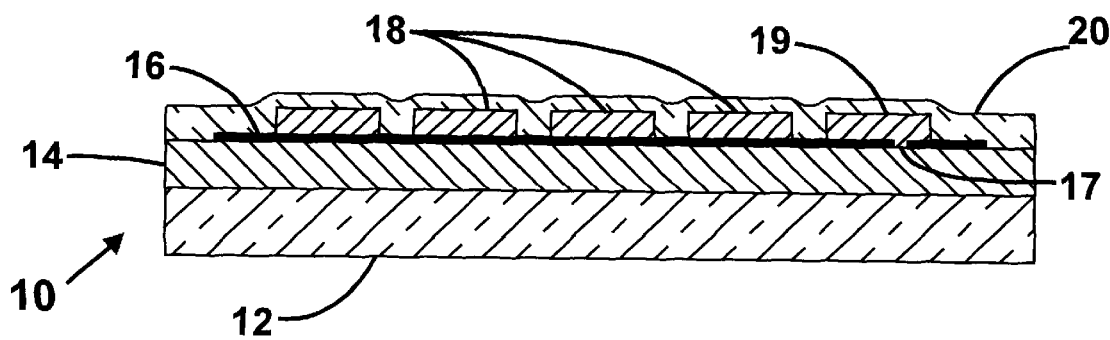

A first preferred method of accomplishing this formation of the second conductive layer is explained with reference to FIGS. 3–6, which show various views of the capacitor array structure during fabrication according to the first preferred method. As shown in FIG. 3, a photoresist layer 20 is formed over the capacitor array structure, such as by standard spin coating techniques well-known in the art. Photoresist layer 20 is substantially non-conductive, and serves as and electrical insulation layer. Layer 20 may comprise a negative-type photoresist, a positive-type photoresist, or an image reversing photoresist and the like. The resulting structure is then exposed to a scanning electron beam under appropriate vacuum conditions, such as found in a scanning electron microscope (SEM) device. The energy and dosage of the electron beam are sufficiently low so as to not substantially expose photoresist layer 20. With the first conductive layer 14 grounded, negative electrical charge builds up on those pads 18 which are electrically isolated from first layer 14, the charge build-up being indicative of good segmented capacitors. For those pads 18 which are shorted to conductive layer 14, such as in a defective capacitor, the electrical charge from the scanning electron beam is discharged through the short 17 and no electrical charge accumulates on the defective pad.

Figure 4:
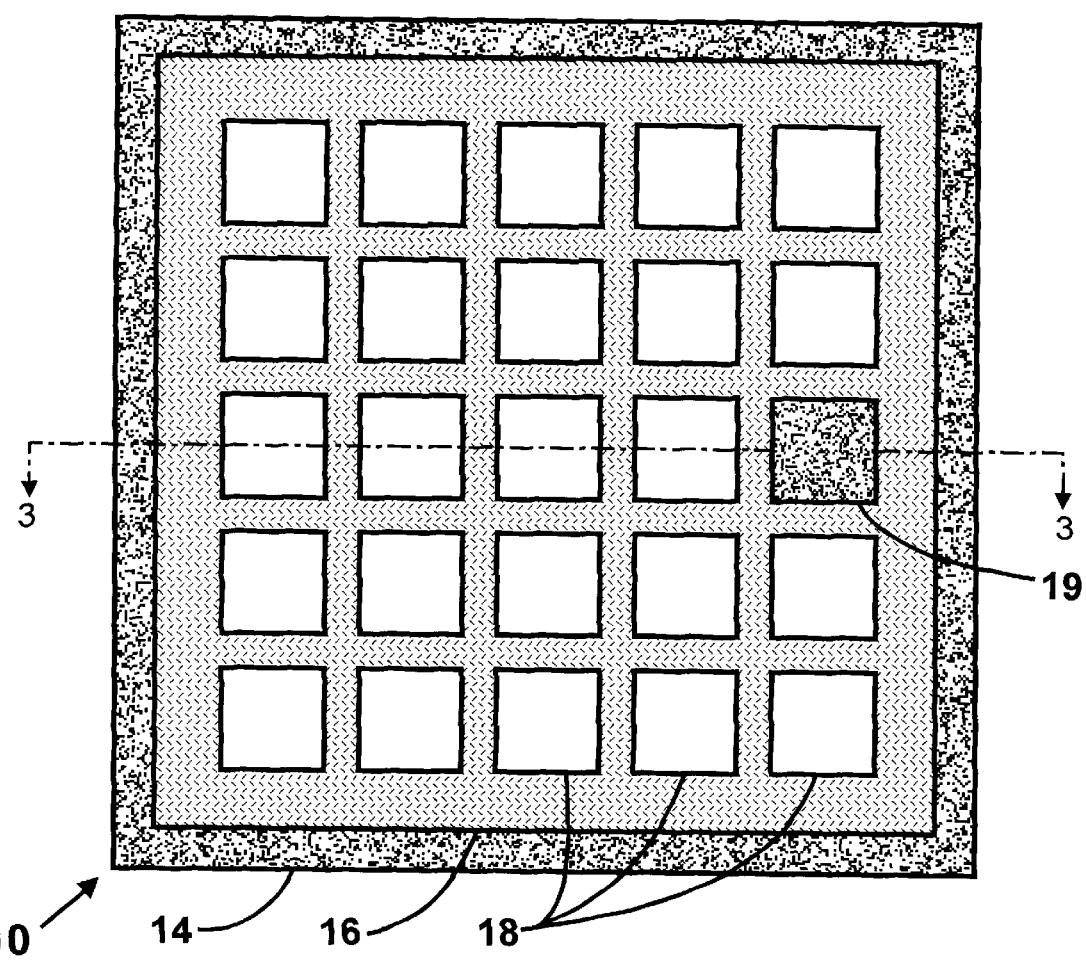

The accumulation of the charge on the good pads alters the amount of secondary electrons that are emitted when the electron beam strikes the floating pads 18, which generates a difference in the quantity of emitted secondary electrons between good and bad pads 18. This difference may be seen through a scanning electron microscope as a difference in the gray-scale tone (i.e. contrast or color) of the pads 18. A representation of the tone difference is shown in FIG. 4, which is a top-plan view of the capacitor structure under SEM conditions. The defective pads can be readily identified by visual inspection.

Figure 5:
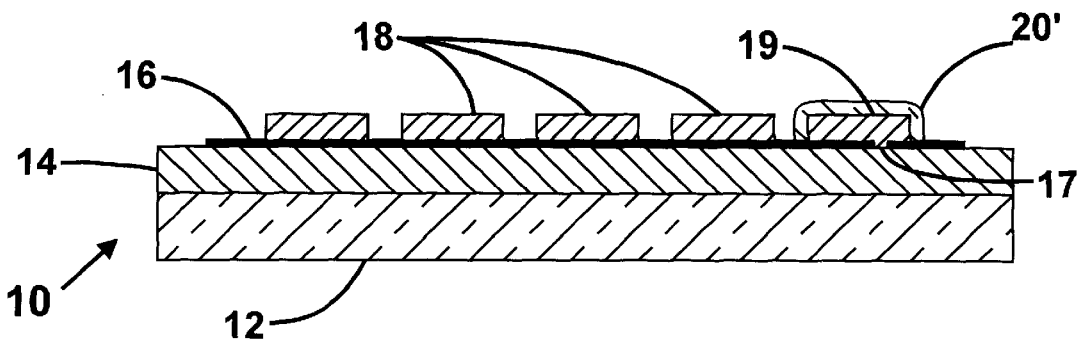
Figure 6:
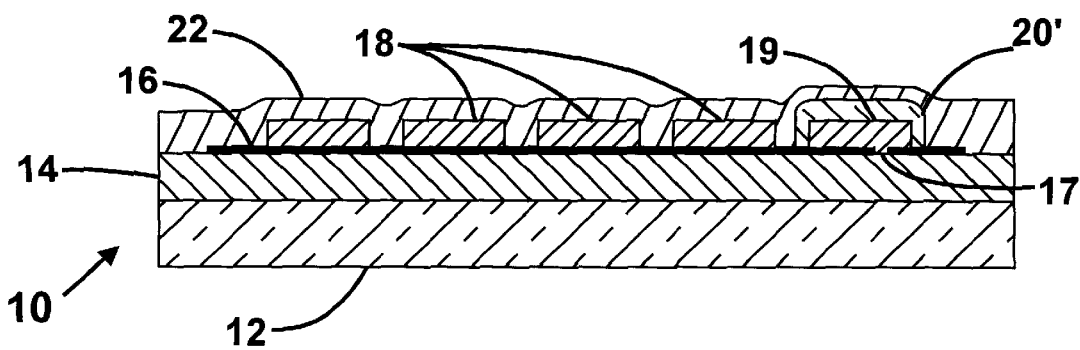

Once the defective pads are identified, those portion of photoresist layer 20 overlying the pads 18 of good capacitor structures are removed, and those portions overlying the pads 18 of defective segmented capacitors 19 are retained, as shown in FIG. 5. Portions of layer 20 which surround the side walls of the defective pads 18 are preferable retained as well. The selective removal is accomplished by exposing the structure to patterned actinic radiation and subsequently developing the exposed photoresist. For negative photoresists, the selective exposure may be accomplished by selectively focusing a spot of ultra-violet light or electron-beam radiation over the pads 18 of the identified defective capacitors. For positive photoresists, the selective exposure may be accomplished by exposing the areas between pads 18 through a photo mask and by sequentially focusing a spot of actinic radiation on the pads 18 of good capacitors. The spot focusing may be accomplished by generating a set of photo masks, each photo mask exposing only a corresponding pad 18. Presently, negative resists are preferred.

In preferred embodiments of the first method, photoresist layer 20 is exposed within the SEM environment by using an increased dosage and energy in the electron beam. This may be readily accomplished in many SEM systems by merely focusing in on the pad to be exposed (good pads in the case of positive resists, defective pads in the case of negative resists) and thereafter increasing the electron beam and dosage for a time sufficient to activate the photoresist. For increased production, it is contemplated by the inventors that a pattern-recognition and control means (e.g., a processor which can access the scanned SEM image in electronic form, plus optical recognition software running on the processor) may be used to identify the defective capacitors and to thereafter direct the control of the electron beam so as to cause the beam to pattern expose photoresist layer 20. In the case where layer 20 comprises a negative-type photoresist, the pattern-recognition and control means causes the electron beam to scan the pads 18 of defective capacitors. In the case where layer 20 comprises a positive-type photoresist, the means cases to electron beam to scan the pads 18 of good capacitors and the areas between the good pads.

The generation of the tone contrast between pads 18 of good and bad capacitors within the SEM environment does not requite the presence of layer 20. Accordingly, the capacitor array 10 may be tested within the SEM environment without layer 20, and layer 20 may be formed, exposed and developed after the bad capacitors have been identified. This sequence may be convenient when layer 20 is not pattern exposed within the SEM environment.

Once layer 20 has been selectively exposed, it is thereafter developed to leave an insulating cap over the pads of defective capacitive structures 19. This is shown in FIG. 5, where the remainder of dielectric layer 20 is indicated at 20'. Layer 20 may be developed by any of the standard methods known in the art. Other photo-sensitive materials, such as photo-sensitive polyimides, may be used for layer 20.

Second conductive layer 22 is thereafter formed over the top of the capacitor array, which electrically couples together all of the good pads 18. The good segmented capacitors are thereby electrically coupled in parallel to provide a capacitor of high value having substantially no defects, since these defects have been isolated with insulating cap layers 20'.

As a modification to the first preferred method, the segmented capacitors may be tested with electrical probes (e.g., "pogo" pins) to identify the defective capacitors before layer 20 is formed. For testing, a single test probe may be sequentially positioned over each pad 18, or an array of probes, such as found in a probe card, may be positioned in corresponding relationship to pads 18. Thereafter, layer 20 may be formed, selectively exposed and developed to form cap layers 20'. As another modification of the first method, layer 20 may comprise a first sub-layer of an insulating material, such as silicon dioxide, and a second sub-layer of a photo-sensitive material (such as photoresist) overlying the insulating sub-layer. The second sub-layer is processed as described above, and thereafter serves as an etch mask to pattern the underlying sub-layer of insulating material. The insulating sub-layer is subsequently etched (dry or wet), and the top photo-sensitive layer is removed, leaving the insulating sub-layer to cap over the pads 18 of bad capacitors. As an advantage, the insulating material may be chosen to have more suitable characteristics than the photoresist material, such as thermal expansion coefficient and ability to withstand high-temperature processing steps.

Figure 7:
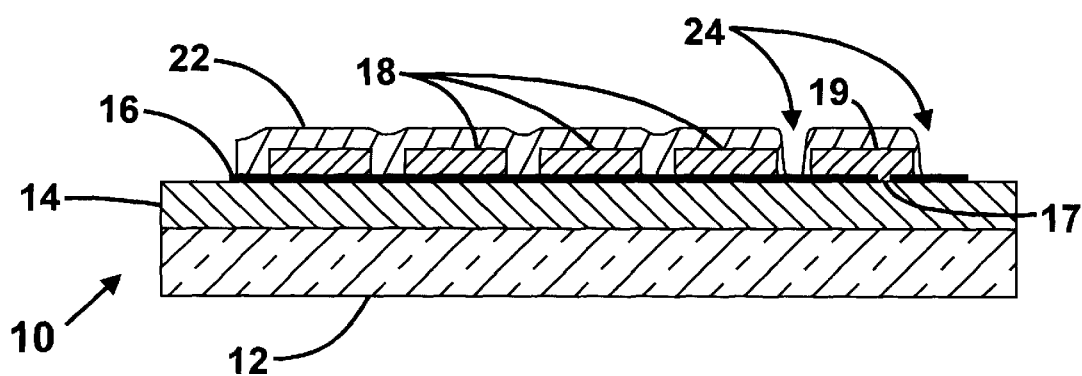
FIGS. 7 and 8 are cross-sectional and top-plan views, respectively, of a capacitor structure during fabrication according to a second preferred method according to the present invention.
Figure 8:
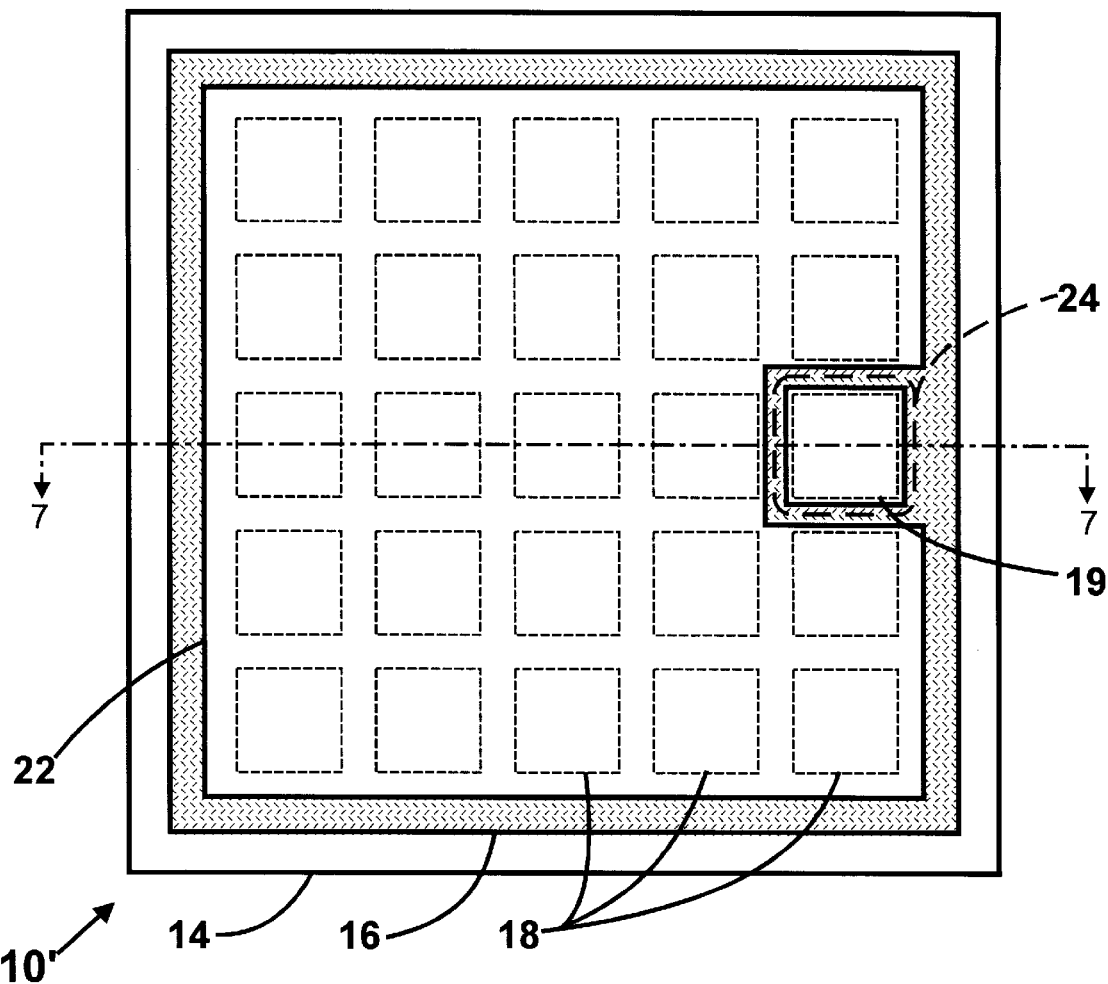

A second preferred embodiment of the present invention is shown by way of FIGS. 1, 2, 7 and 8. Starting from the capacitor array shown in FIGS. 1 and 2 where capacitor pads 18 are formed over dielectric 16 and first layer 14, the segmented capacitors are tested (such as by any of the above-described methods) to identify the defective capacitors. Thereafter, second conductive layer 22 is formed over pads 18, as shown in FIGS. 7 and 8. At this point, all pads 18 are electrically coupled to one another, including those pads 18 associated with defective segmented capacitors.

A laser is then used to scribe a perimeter around each defective capacitor (e.g., by laser ablation), the perimeter extending through the thickness of the second conductive layer 22. The scribed perimeters electrically isolate the pads 18 of the defective capacitors from the pads of the good capacitors. An exemplary scribe boundary is shown at 24 in FIGS. 7 and 8. A top-plan view thereof is shown in FIG. 8. (Although each pad 18 is covered by second conductive layer 22, there is a height variation in layer 22 around the perimeter of each pad 18 which can be readily seen for the purpose of identifying the perimeters of the pads 18.) In place of using a laser to form scribed boundaries, conventional patterned-etching techniques may be used, in which case the portion of layer 22 which overlies the defective pad can be removed as well.

Figure 9:
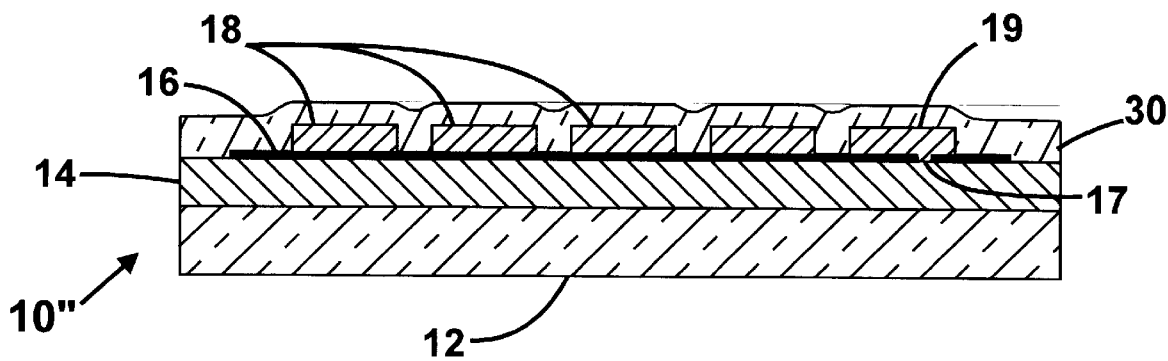
FIGS. 9–11 and 12 are cross-sectional and top-plan views, respectively, of a capacitor structure during fabrication according to a third preferred method according to the present invention.
Figure 10:
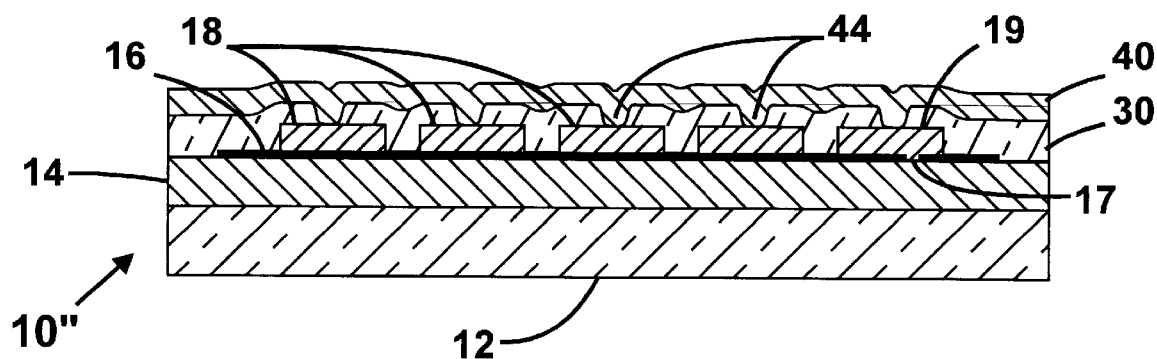

A third preferred embodiment of the present invention is shown by way of FIGS. 1, 2, and 9–12. Starting from the capacitor array shown in FIGS. 1 and 2 where capacitor pads 18 are formed over dielectric layer 16 and first layer 14, the segmented capacitors are tested (such as by any of the above-described methods) to identify the defective capacitors. Thereafter, an electrically insulating layer 30 is formed over pads 18 and the exposed portions of first dielectric layer 16 and base layer 14, as shown in FIG. 9. Insulating layer 30 may be formed prior to SEM testing, if desired. Referring to FIG. 10, a via 44 is formed through layer 30 over each pad 18. If layer 30 comprises a photoresist or other photosensitive material, vias 44 may be formed by pattern exposing layer 30 and thereafter developing it. If layer 30 does not comprise a photosensitive material, vias 44 may be formed by etching though a patterned mask. Wet and dry etching processes may be utilized.

A second conductive layer 40 is then formed over insulating layer 30 and the portions of pads 18 which are exposed by vias 44 (FIG. 10). Second conductive layer 40 electrically couples pads 18 to one another. Second conductive layer 40 may comprise a metal and may be formed by any number of deposition processes. Prior to forming layer 40, vias 44 may be pre-filled with conductive material to provide a more planar top surface for layer 40. An electroplating process or a metal lift-off process may be used for pre-filling vias 44.

Figure 11:
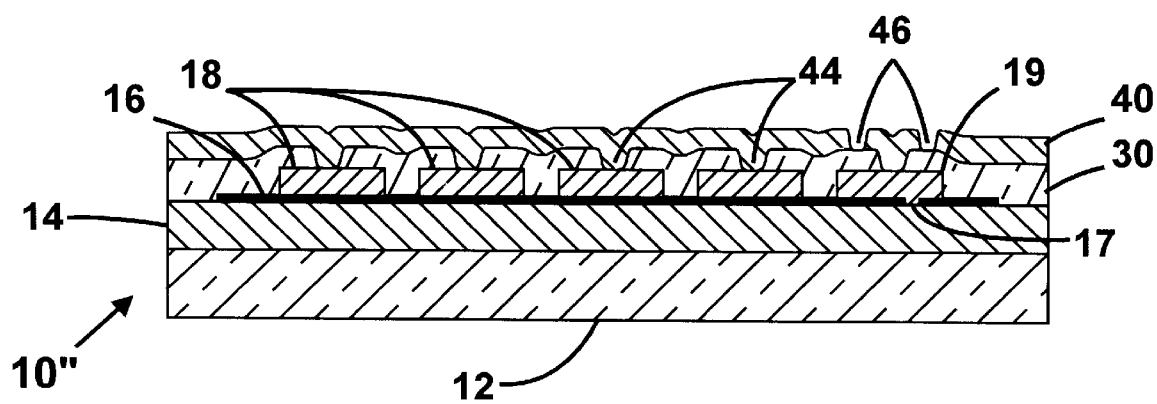
Figure 12:
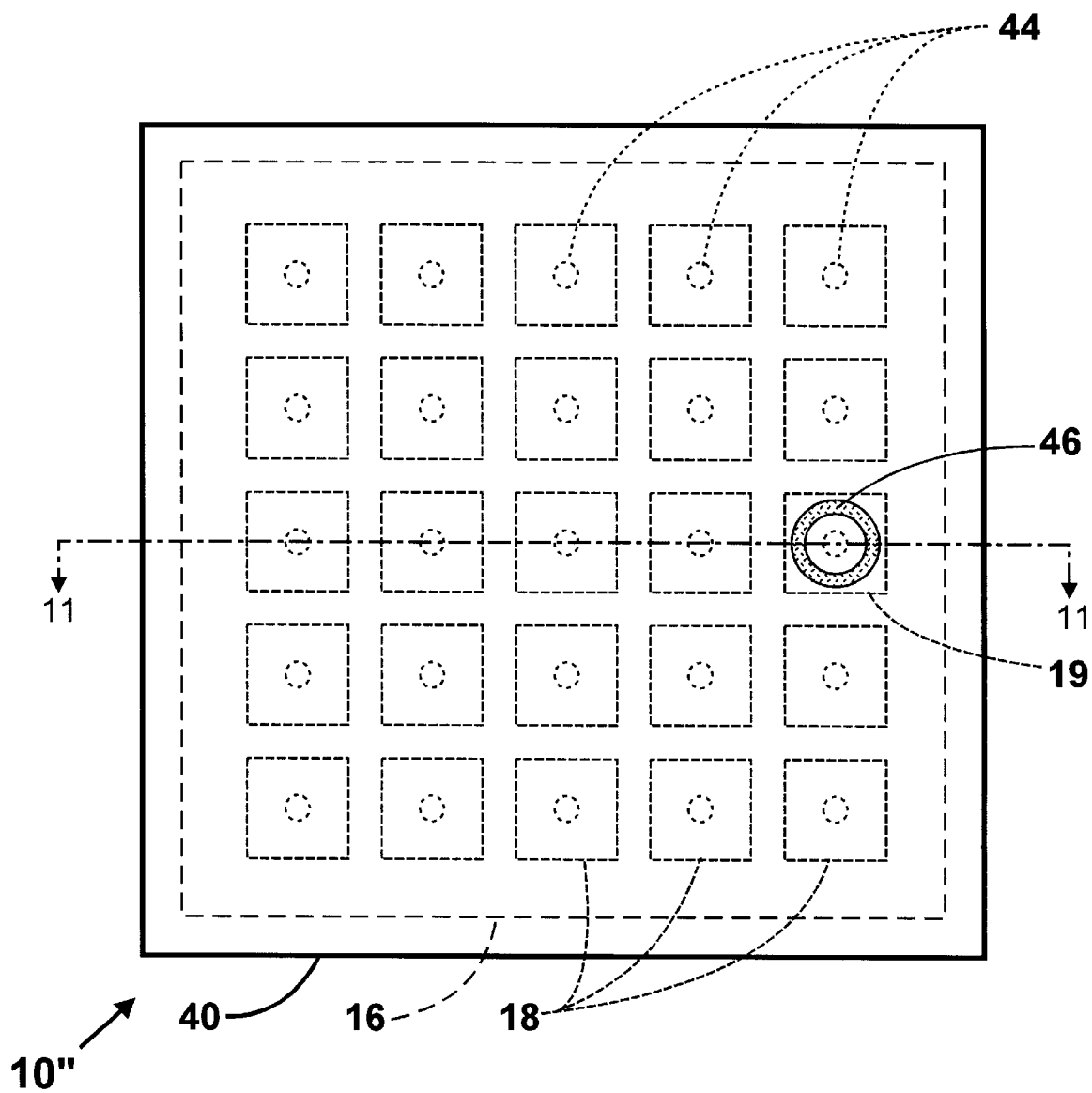

Referring to FIG. 11, an isolation trench 46 is formed in second conductive layer 40 over each bad structure 19 to isolate the pads 18 of the bad segmented capacitor structures 19 from the good structures. Isolation trench 46 surrounds, or is entirely formed over, the via 44 which overlies the bad structure 19. Laser ablation or other scribing procedures described above may be used to form the isolation trenches 46.

The method according to FIGS. 9–12 has the advantage of enabling a relatively planar top surface to be formed after constructing the whole capacitor structure. Specifically, when layer 30 comprises materials which tend to planarize the top surface thereof, such as for example spin-on polyimide and reflowed P-glass, the subsequent conductive layer 40 is relatively planar. As is known in the art, planar surfaces generally aid in improving the yield of subsequent steps.

In the third method, the capacitor structures may be tested by the electron-beam method any time after the pads 18 are formed and before the second conductive layer 40 is formed.

As a modification of the third method, insulating layer 30 may comprise a first sub-layer of an insulating material, such as for example silicon dioxide or polyimide, and a second sub-layer of a photo-sensitive material (such as photoresist) overlying the insulating sub-layer. The second sub-layer is processed as described above, and thereafter serves as an etch mask to pattern the underlying sub-layer of insulating material. The insulating sub-layer is subsequently etched (dry or wet), and the top photo-sensitive layer is removed, leaving the insulating sub-layer to cap over the pads 18 of bad capacitors. As an advantage, the insulating material may be chosen to have more suitable characteristics than the photoresist material, such as thermal expansion coefficient and greater ability to withstand high-temperature processing steps. Before the photo-sensitive sub-layer is removed, a layer of conductive material may be formed over layer 30 to pre-fill vias 44, with the photo-sensitive sub-layer acting as a lift-off mask.

As a second modification, which is particularly suitable when electron beam testing is used, vias 44 are only formed over the pads 18 of good capacitor structures. In this modification, layer 30 may comprise a positive photo-sensitive material (or top sub-layer thereof), and the structures may be tested in an SEM environment after layer 30 is formed. After the SEM testing, the electron beam may be focused in a spot over each good capacitor structure to expose the positive photoresist thereat, and the photoresist may then be developed to form the vias 44. Without vias formed over defective capacitor structures, the subsequent step of forming trenches 46 can be eliminated.

The first and second modifications, and/or features thereof, may be combined to provide further modifications.

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method of forming a capacitor comprising the steps of:
   (a) forming a dielectric layer over a first conductive layer;
   (b) forming a plurality of conductive pads over said dielectric layer, each pad forming a capacitor structure with said dielectric layer and said first conductive layer;
   (c) testing the capacitor structures to find each capacitor structure which has a defective capacitance; and
   (d) forming a second conductive layer over said pads such that said second conductive layer is electrically isolated from pads of defective capacitor structures.

2. The method of claim 1 wherein said step (d) comprises the steps of forming said second conductive layer over said pads and thereafter separating each portion of said second layer which overlies a pad of a defective capacitor structure from the remainder of said second conductive layer.

3. The method of claim 2 wherein said portions of said second conductive layer overlying pads of defective capacitors are separated by laser cutting.

4. The method of claim 2 wherein said portions of said second conductive layer overlying pads of defective capacitors are separated by pattern etching.

5. The method of claim 1 wherein said step (d) comprises the steps of forming an insulating layer over each pad of a defective capacitor structure, and forming a blanket layer of conductive material over said pads.

6. The method of claim 1 wherein said step (d) comprises the steps of:
   forming a layer of photo-sensitive material over said pads, the solubility of said photo-sensitive material in a developer solution being a function of exposure to actinic radiation;
   exposing said layer of photo-sensitive material to actinic radiation and developing the exposed layer in the developer solution such that a portion of said photo-sensitive material remains over each pad of a defective capacitor structure; and
   forming a blanket layer of conductive material over said pad.

7. The method of claim 6 wherein said capacitor structures are tested by scanning an electron beam thereover and detecting a contrast difference in the emitted secondary electrons, and wherein said testing occurs after said photo-sensitive material is formed over said pads, and wherein the pads are scanned by an electron beam having a level of electron energy and dosage which does not substantially alter the solubility of the photo-sensitive material.

8. The method of claim 7 wherein an electron beam is used to selectively expose a portion of said photoresist material which overlies a pad of a defective capacitor structure.

9. The method of claim 1 wherein said capacitor structures are tested by a direct electrical measurement with an electrical probe contacting each conductive pad.

10. The method of claim 1 wherein said capacitor structures are tested by scanning an electron beam thereover and detecting a contrast difference in the emitted secondary electrons.

11. The method of claim 1 wherein said step (d) comprises, prior to forming said second conductive layer, the steps of: forming an insulating layer over the pads of at least one defective capacitor structure and at least one non-defective capacitor structure; and forming a via through said insulating layer over each non-defective capacitor structure.

12. The method of claim 11 wherein said vias are filled with conductive material when said second conductive layer is formed.

13. The method of claim 11 further comprising the step of filling said vias with conductive material prior to forming said second conductive layer.

14. The method of Claim 11 wherein said insulating layer comprises a top sub-layer and a bottom sub-layer, said top sub-layer comprising a photo-sensitive material.

15. The method of claim 1 wherein said step (d) comprises the steps of:
   prior to forming said second conductive layer, forming an insulating layer over the pads of at least one defective capacitor structure and at least one non-defective capacitor structure, and forming a via through said insulating layer over each of said capacitor structures; and
   after forming said second conductive layer, removing a portion of said second conductive layer around each via that overlies a defective capacitor structure.

16. A method of forming a capacitor comprising the steps of:
   (a) forming a dielectric layer over a first conductive layer;
   (b) forming a plurality of conductive pads over said dielectric layer, each pad forming a capacitor structure with said dielectric layer and said first conductive layer;

(c) forming an insulating layer over at least two capacitor pads;

(d) forming a via through said insulating layer over each of said capacitor pads;

(e) forming a second conductive layer over said insulating layer;

(f) prior to step (e), testing the capacitor structures to find each capacitor structure which has a defective capacitance; and (g) removing a portion of said second conductive layer around each via which overlies a defective capacitor structure.

17. A method of forming a capacitor comprising the steps of:

(a) forming a dielectric layer over a first conductive layer;

(b) forming a plurality of conductive pads over said dielectric layer, each pad forming a capacitor structure with said dielectric layer and said first conductive layer;

(c) testing the capacitor structures to find each capacitor structure which has a defective capacitance by exposing the capacitor structures to an electron beam and thereafter detecting a contrast difference in the emitted secondary electrons; and (d) forming a second conductive layer over said pads such that said second conductive layer is electrically isolated from pads of defective capacitor structures.

18. The method of claim 17 wherein said step (d) comprises the steps of forming said second conductive layer over said pads and thereafter separating each portion of said second layer which overlies a pad of a defective capacitor structure from the remainder of said second conductive layer.

19. The method of claim 17 wherein said step (d) comprises the steps of forming an insulating layer over each pad of a defective capacitor structure, and forming a blanket layer of conductive material over said pads.

20. The method of claim 17 wherein said step (d) comprises the steps of:

forming a layer of photo-sensitive material over said pads, the solubility of said photo-sensitive material in a developer solution being a function of exposure to actinic radiation;

exposing said layer of photo-sensitive material to actinic radiation and developing the exposed layer in the developer solution such that a portion of said photo-sensitive material remains over each pad of a defective capacitor structure; and forming a blanket layer of conductive material over said pad.

21. The method of claim 20 wherein said testing occurs after said photo-sensitive material is formed over said pads, and wherein the pads are scanned by an electron beam having a level of electron energy and dosage which does not substantially alter the solubility of the photo-sensitive material.

22. The method of claim 17 wherein said step (d) comprises, prior to forming said second conductive layer, the steps of:

forming an insulating layer over the pads of at least one defective capacitor structure and at least one non-defective capacitor structure; and forming a via through said insulating layer over each non-defective capacitor structure.

23. The method of claim 17 wherein said step (d) comprises the steps of:

prior to forming said second conductive layer, forming an insulating layer over the pads of at least one defective capacitor structure and at least one non-defective capacitor structure, and forming a via through said insulating layer over each of said capacitor structures; and after forming said second conductive layer, removing a portion of said second conductive layer around each via that overlies a defective capacitor structure.

24. A method of forming a capacitor comprising the steps of:

(a) forming a dielectric layer over a first conductive layer;

(b) forming a plurality of conductive pads over said dielectric layer, each pad forming a capacitor structure with said dielectric layer and said first conductive layer;

(c) testing the capacitor structures to find each capacitor structure which has a defective capacitance; and (d) forming a second conductive layer over said pads and thereafter separating each portion of said second layer which overlies a pad of a defective capacitor structure from the remainder of said second conductive layer.

25. A method of forming a capacitor comprising the steps of:

(a) forming a dielectric layer over a first conductive layer;

(b) forming a plurality of conductive pads over said dielectric layer, each pad forming a capacitor structure with said dielectric layer and said first conductive layer;

(c) testing the capacitor structures to find each capacitor structure which has a defective capacitance;

(d) forming an insulating layer over each pad of a defective capacitor structure; and (e) thereafter forming a blanket layer of conductive material over said pads.

26. A method of forming a capacitor comprising the steps of:

(a) forming a dielectric layer over a first conductive layer;

(b) forming a plurality of conductive pads over said dielectric layer, each pad forming a capacitor structure with said dielectric layer and said first conductive layer;

(c) testing the capacitor structures to find each capacitor structure which has a defective capacitance;

(d) forming an insulating layer over the pads of at least one defective capacitor structure and at least one non-defective capacitor structure;

(e) forming a via through said insulating layer over each non-defective capacitor structure; and (f) thereafter forming a second conductive layer over said pads.

* * * * *

UNITED STATES PATENT AND TRADEMARK OFFICE
CERTIFICATE OF CORRECTION

PATENT NO. : 5,817,533
DATED : October 6, 1998
INVENTOR(S) : Sen et al.

It is certified that error appears in the above-identified patent and that said Letters Patent is hereby corrected as shown below:

Column 4, line 14, delete the second instance of "and" and substitute therefor --an--.

Column 4, line 42, delete "portion" and substitute therefor --portions--.

Column 5, line 13, delete "cases to" and substitute therefor --causes the--.

Column 5, line 18, delete "requite" and substitute therefor --require--.

Column 8, line 15, delete "pad" and substitute therefor --pads--.

Column 9, line 51, delete "pad" and substitute therefor --pads--.

Signed and Sealed this

Twenty-eighth Day of September, 1999

Attest:

Q. TODD DICKINSON

*Attesting Officer*  *Acting Commissioner of Patents and Trademarks*